United States Patent
Shindome et al.

(10) Patent No.: US 10,373,833 B2
(45) Date of Patent: Aug. 6, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Aya Shindome, Yokohama (JP); Masahiko Kuraguchi, Yokohama (JP); Hisashi Saito, Yokohama (JP); Shigeto Fukatsu, Yokohama (JP); Miki Yumoto, Kawasaki (JP); Yosuke Kajiwara, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/056,013

(22) Filed: Feb. 29, 2016

(65) Prior Publication Data

US 2016/0284831 A1    Sep. 29, 2016

(30) Foreign Application Priority Data

Mar. 24, 2015    (JP) ................. 2015-060251

(51) Int. Cl.
*H01L 29/20*    (2006.01)
*H01L 21/265*    (2006.01)
(Continued)

(52) U.S. Cl.
CPC ...... *H01L 21/2654* (2013.01); *H01L 21/7605* (2013.01); *H01L 29/4236* (2013.01);
(Continued)

(58) Field of Classification Search
CPC ................ H01L 29/7786; H01L 29/66522
See application file for complete search history.

(56) References Cited

U.S. PATENT DOCUMENTS

2007/0170499 A1    7/2007  Araki
2012/0138948 A1    6/2012  Miyajima et al.
(Continued)

FOREIGN PATENT DOCUMENTS

JP    2007-194562    8/2007
JP    2008-141040    6/2008
(Continued)

OTHER PUBLICATIONS

Ki-Won Kim et al. "Effects of TMAH Treatment on Device Performance of Normally Off $Al_2O_3$/GaN MOSFET", IEEE Electron Device Letters, vol. 32, No. 10, Oct. 2011, 3 Pages.

(Continued)

*Primary Examiner* — Trang Q Tran
(74) *Attorney, Agent, or Firm* — Oblon, McClelland, Maier & Neustadt, L.L.P.

(57) ABSTRACT

A semiconductor device of an embodiment includes a first GaN-based semiconductor layer, a second GaN-based semiconductor layer provided on the first GaN-based semiconductor layer and having a larger bandgap than the first GaN-based semiconductor layer, a source electrode provided on the second GaN-based semiconductor layer, a drain electrode provided on the second GaN-based semiconductor layer, a recess provided between the source electrode and the drain electrode in the second GaN-based semiconductor layer, a gate insulating film provided on a surface of the recess, and a gate electrode provided on the gate insulating film and having an end portion in a gate width direction, located in the recess.

24 Claims, 8 Drawing Sheets

(51) Int. Cl.
- *H01L 29/423* (2006.01)
- *H01L 21/76* (2006.01)
- *H01L 29/778* (2006.01)
- *H01L 29/417* (2006.01)

(52) U.S. Cl.
CPC ...... *H01L 29/7786* (2013.01); *H01L 29/2003* (2013.01); *H01L 29/41758* (2013.01)

(56) References Cited

U.S. PATENT DOCUMENTS

| | | |
|---|---|---|
| 2014/0091365 A1 | 4/2014 | Kikkawa et al. |
| 2014/0131720 A1* | 5/2014 | Hsiung ............... H01L 29/4236 257/76 |
| 2015/0145004 A1* | 5/2015 | Inoue ................. H01L 29/4236 257/192 |

FOREIGN PATENT DOCUMENTS

| | | |
|---|---|---|
| JP | 2012-119582 | 6/2012 |
| JP | 2013-26593 A | 2/2013 |
| JP | 2014-72377 | 4/2014 |
| JP | 2014-135439 A | 7/2014 |

OTHER PUBLICATIONS

Masahito Kodama et al. "GaN-Based Trench Gate Metal Oxide Semiconductor Field-Effect Transistor Fabricated with Novel Wet Etching", Applied Physics Express 1, Feb. 2008, 4 Pages.

Japanese Office Action dated Nov. 8, 2018 in JP Patent Application No. 2015-060251 (with English Translation).

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-060251, filed on Mar. 24, 2015, the entire contents of which are incorporated herein by reference.

FIELD

Embodiments described herein relate generally to a semiconductor device and a method for manufacturing the same.

BACKGROUND

A semiconductor device such as a switching device or a diode is used in a circuit such as a switching power supply or an inverter. These semiconductor devices are required to have a high breakdown voltage and a low on-resistance. A relation between the breakdown voltage and the on-resistance is a trade-off relation depending on a semiconductor material used for the device.

Due to the progress of the technological development so far, a semiconductor device having a low on-resistance close to a limit of silicon has been realized. In order to further improve the breakdown voltage or further reduce the on-resistance, it is necessary to change the semiconductor material from silicon. It is possible to improve the trade-off relation depending on a material and to significantly increase the breakdown voltage and reduce the on-resistance by using a GaN-based semiconductor such as GaN or AlGaN, or a wide bandgap semiconductor such as silicon carbide (SiC) as the semiconductor material for switching device.

However, for example, in a switching device using the GaN-based semiconductor, a parasitic leakage path may be formed between electrodes due to a process peculiar to the GaN-based semiconductor and a leakage current of the device may be increased.

DETAILED DESCRIPTION

A semiconductor device of an embodiment of the present disclosure includes a first GaN-based semiconductor layer, a second GaN-based semiconductor layer provided on the first GaN-based semiconductor layer and having a larger bandgap than the first GaN-based semiconductor layer, a source electrode provided on the second GaN-based semiconductor layer, a drain electrode provided on the second GaN-based semiconductor layer, a recess provided between the source electrode and the drain electrode in the second GaN-based semiconductor layer, a gate insulating film provided on a surface of the recess, and a gate electrode provided on the gate insulating film and having an end portion in a gate width direction, located in the recess.

Here, the same reference sign is given to the same or similar components, and repeated description thereof may be omitted.

Here, the "GaN-based semiconductor" is a general term for a semiconductor including GaN (gallium nitride), AlN (aluminum nitride), InN (indium nitride), and an intermediate composition thereof.

Here, "undoped" means that a dopant concentration is $1 \times 10^{15}$ cm$^{-3}$ or less.

Here, an upper direction in the drawings is described by "upper", and a lower direction in the drawings is described by "lower", in order to indicate positional relations between components or the like. Here, concepts of "upper" and "lower" do not necessarily indicate a relation to the gravity direction.

First Embodiment

A semiconductor device of the present embodiment includes a first GaN-based semiconductor layer, a second GaN-based semiconductor layer provided on the first GaN-based semiconductor layer and having a larger bandgap than the first GaN-based semiconductor layer, a source electrode provided on the second GaN-based semiconductor layer, a drain electrode provided on the second GaN-based semiconductor layer, a recess provided between the source electrode and the drain electrode on the second GaN-based semiconductor layer, a gate insulating film provided on a surface of the recess, and a gate electrode provided on the gate insulating film and having an end portion in a gate width direction, located in the recess.

Figure 1:
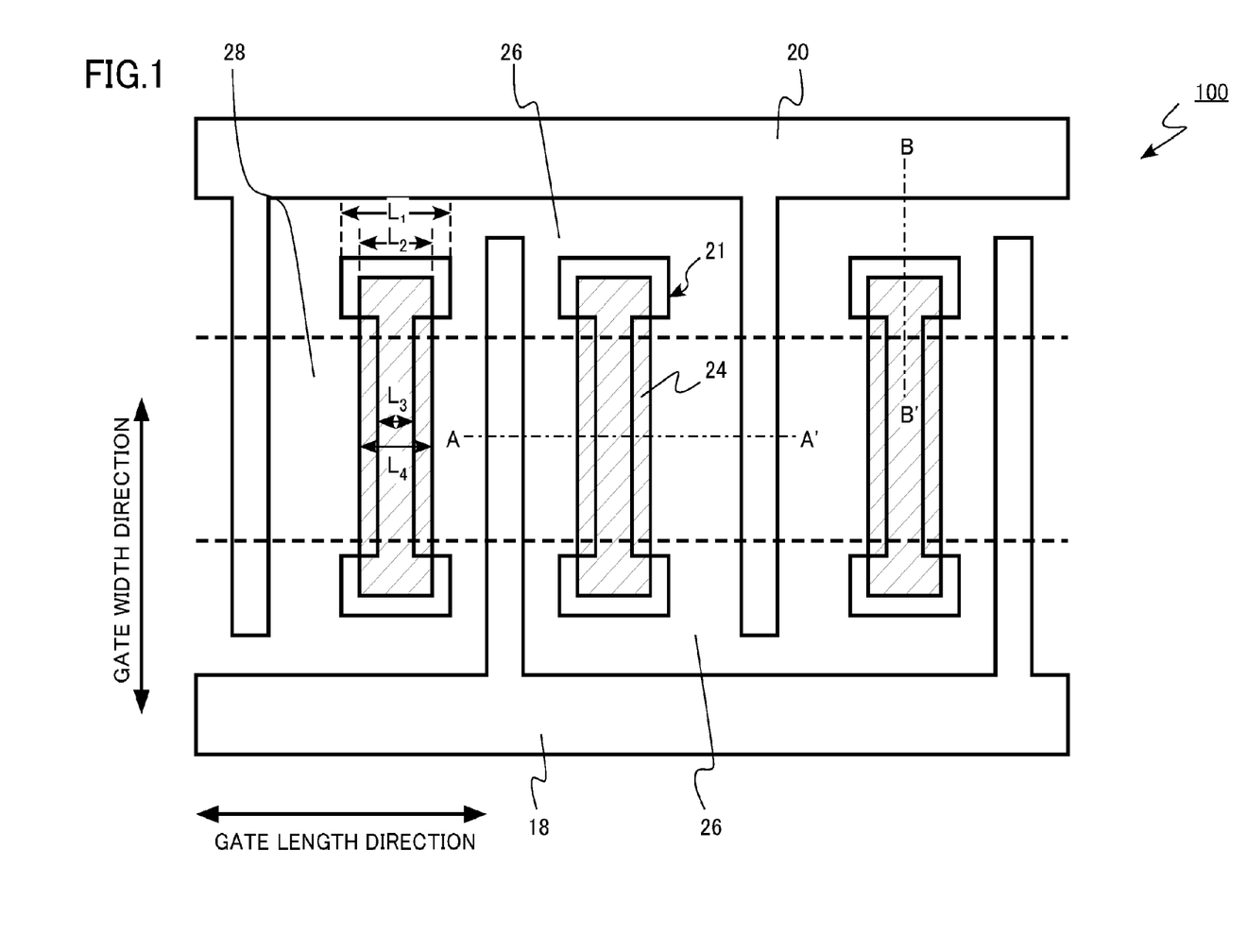
FIG. 1 is a schematic plan view of a semiconductor device of a first embodiment.
Figure 2:
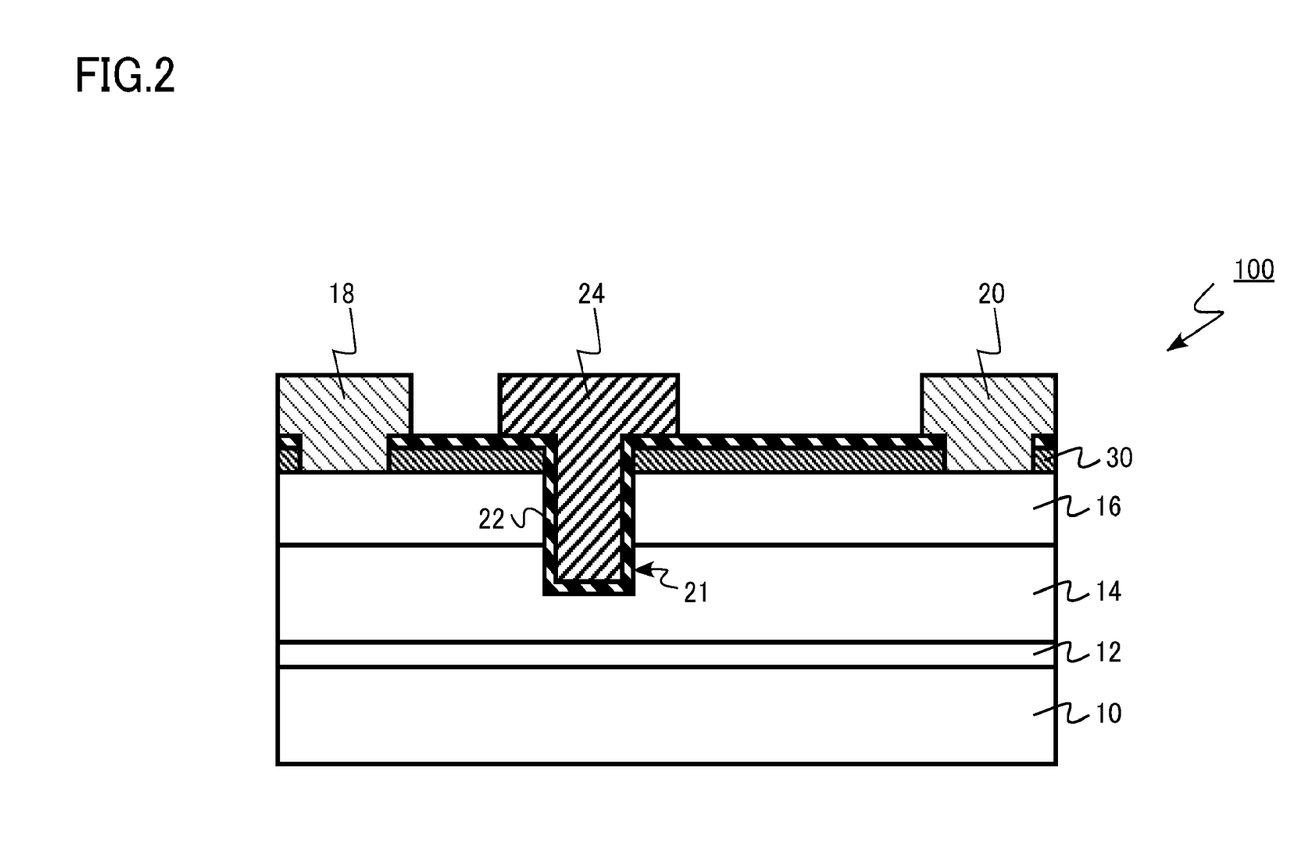
FIG. 2 is a schematic view at the AA' cross section in FIG. 1.
Figure 3:
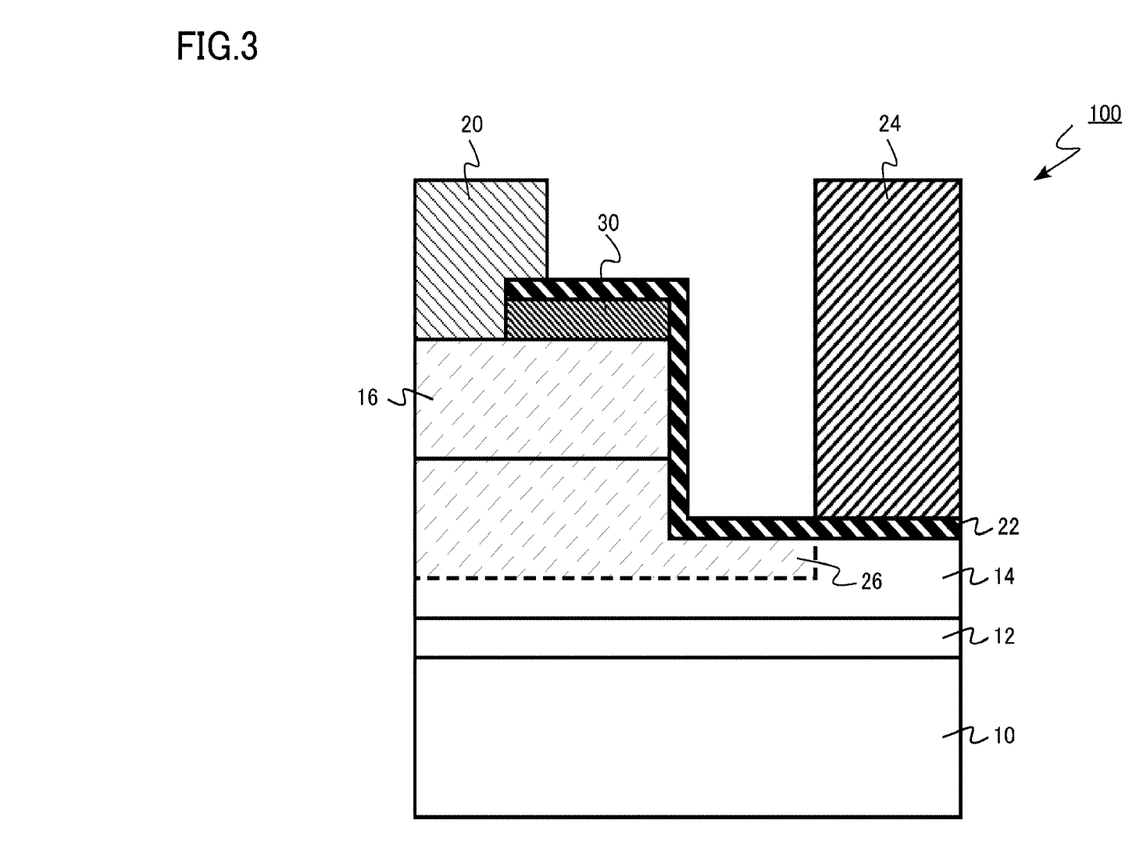
FIG. 3 is a schematic view at the BB' cross section in FIG. 1.

FIG. 1 is a schematic plan view of the semiconductor device of the present embodiment. FIG. 2 is a schematic view at the AA' cross section in FIG. 1. FIG. 3 is a schematic view at the BB' cross section in FIG. 1.

The semiconductor device of the present embodiment is a high electron mobility transistor (HEMT) using a GaN-based semiconductor. The HEMT of the present embodiment has a so-called gate/recess structure in which a gate electrode is embedded in a recess formed in a semiconductor layer.

As illustrated in FIGS. 1 to 3, a semiconductor device (HEMT) 100 includes a substrate 10, a buffer layer 12, a channel layer (first GaN-based semiconductor layer) 14, a barrier layer (second GaN-based semiconductor layer) 16, a source electrode 18, a drain electrode 20, a recess 21, a gate insulating film 22, a gate electrode 24, a device isolation region (device isolation region) 26, a device region (active region) 28, and a protection film 30.

The substrate 10 is formed, for example, of silicon (Si). In addition to silicon, for example, sapphire (Al$_2$O$_3$) or silicon carbide (SiC) can be applied.

The buffer layer 12 is provided on the substrate 10. The buffer layer 12 relaxes lattice mismatch between the substrate 10 and the channel layer 14. The buffer layer 12 is formed, for example, of a multilayer structure of aluminum gallium nitride (Al$_w$Ga$_{1-w}$N (0<W<1)).

The channel layer 14 is provided on the buffer layer 12. The channel layer 14 is also referred to as an electron transit layer. The channel layer 14 is formed, for example, of undoped $Al_xGa_{1-x}N$ ($0 \leq X < 1$). More specifically, the channel layer 14 is formed, for example, of undoped GaN. The channel layer 14 has a thickness, for example, of 0.1 μm or more and 10 μm or less.

The barrier layer 16 is provided on the channel layer 14. The barrier layer 16 is also referred to as an electron supply layer. The bandgap of the barrier layer 16 is larger than that of the channel layer 14. The barrier layer 16 is formed, for example, of undoped $Al_yGa_{1-y}N$ ($0 < Y \leq 1$, $X < Y$). More specifically, the barrier layer 16 is formed, for example, of undoped $Al_{0.25}Ga_{0.75}N$. The barrier layer 16 has a thickness, for example, of 10 nm or more and 100 nm or less.

An interface between the channel layer 14 and the barrier layer 16 is a heterojunction interface. Two-dimensional electron gas (2DEG) is formed at the heterojunction interface of the HEMT 100 to become a carrier.

The device isolation region 26 is provided in a part of the channel layer 14 and the barrier layer 16. A region surrounded by the device isolation region 26 is the device region 28. The device region 28 is an active region in which a carrier flows when the HEMT 100 performs on-operation. The device isolation region 26 electrically isolates the device region 28. The device isolation region 26 has a higher resistance than the device region 28.

The device isolation region 26 is formed, for example, by implantation of at least one kind of ion selected from argon (Ar), nitrogen (N), boron (B), and phosphorus (P) into a part of the channel layer 14 and the barrier layer 16. In the device isolation region 26, the concentration of at least one kind of element selected from argon (Ar), nitrogen (N), boron (B), and phosphorus (P) is higher than that in the device region 28. The crystallinity of the device isolation region 26 is inferior to that of the device region 28.

The protection film 30 is provided on apart of a surface of the barrier layer 16. The protection film 30 is formed, for example, of silicon nitride (SiN). The protection film 30 has a thickness, for example, of 10 nm or more and 100 nm or less.

The source electrode 18 and the drain electrode 20 are formed on the barrier layer 16. The source electrode 18 and the drain electrode 20 are, for example, metal electrodes. The metal electrode has, for example, a laminated structure of films selected from titanium (Ti), aluminum (Al), nickel (Ni) and gold (Au). An ohmic contact is preferably formed between the source electrode 18 and the barrier layer 16 and between the drain electrode 20 and the barrier layer 16. A distance between the source electrode 18 and the drain electrode 20 is, for example, 5 μm or more and 30 μm or less.

The gate insulating film 22 is formed on an inner surface of the recess 21 provided in the barrier layer 16 between the source electrode 18 and the drain electrode 20. The gate electrode 24 is provided on the gate insulating film 22. A bottom of the recess 21 is located in the channel layer 14.

The gate insulating film 22 is formed, for example, of silicon oxide ($SiO_x$) or aluminum oxide ($Al_2O_3$). The gate insulating film 22 has a thickness, for example, of 10 nm or more and 100 nm or less.

The gate electrode 24 is, for example, a metal electrode. The metal electrode is formed, for example, of titanium nitride (TiN).

The HEMT 100 of the present embodiment has a gate/recess structure. The bottom of the recess 21 reaches the channel layer 14, and a metal insulator semiconductor (MIS) structure exists just below the gate electrode 24. A voltage applied to the gate electrode 24 controls formation of an inversion layer and a depletion layer in the channel layer 14, and controls on/off of the channel. Therefore, it is possible to realize the normally-off type HEMT 100.

An end portion of the gate electrode 24 in a gate width direction is located in the recess 21. In other words, a fringe with respect to the recess 21 is not provided in the end portion of the gate electrode 24 in the gate width direction, and there is a region in which the gate electrode 24 does not exist in the bottom of the recess 21.

In addition, a length ("$L_1$" in FIG. 1) in a gate length direction at an end portion of the recess 21 in the gate width direction is longer than a length ("$L_2$" in FIG. 1) in the gate length direction at the end portion of the gate electrode 24 in the gate width direction. The end portion of the gate electrode 24 in the gate width direction is surrounded by the region in which the gate electrode 24 does not exist in the bottom of the recess 21.

In addition, a length ("$L_3$" in FIG. 1) in a gate length direction at a central portion of the recess 21 in the gate width direction is shorter than a length ("$L_4$" in FIG. 1) in the gate length direction at the central portion of the gate electrode 24 in the gate width direction. In other words, the gate electrode 24 extends to both sides of the recess 21 in the gate length direction on the device region 28, and a fringe with respect to the recess 21 is provided.

As described above, the recess 21 has an I-shaped structure. In addition, the end portion in the gate width direction of the recess 21 is in the device isolation region 26.

A multi-stage wiring (not illustrated) using an interlayer film and wiring is provided on the gate electrode 24, the source electrode 18, and the drain electrode 20.

Next, an example of a method for manufacturing the semiconductor device of the present embodiment will be described.

The method for manufacturing the semiconductor device of the present embodiment includes forming a recess in a second GaN-based semiconductor layer provided on a first GaN-based semiconductor layer and having a larger bandgap than the first GaN-based semiconductor layer, forming a gate insulating film on a surface of the recess, forming a gate electrode having an end portion in the gate width direction, located in the recess, on the gate insulating film, and performing ion implantation using the gate electrode as a mask to form a device isolation region in the first GaN-based semiconductor layer and the second GaN-based semiconductor layer.

First, the substrate 10, for example, a Si substrate is prepared. Subsequently, for example, the buffer layer 12 is grown on the Si substrate by epitaxial growth. For example, the buffer layer 12 is grown by a metal organic chemical vapor deposition (MOCVD) method.

Subsequently, undoped GaN as the channel layer (first GaN-based semiconductor layer) 14 and undoped $Al_{0.25}Ga_{0.75}N$ as the barrier layer (second GaN-based semiconductor layer) 16 are formed on the buffer layer 12 by epitaxial growth. For example, the channel layer 14 and the barrier layer 16 are grown by the MOCVD method.

The channel layer 14 has a thickness, for example, of 0.1 μm or more and 10 μm or less. The barrier layer 16 has a thickness, for example, of 10 nm or more and 100 nm or less.

Subsequently, the protection film 30 is formed on the barrier layer 16. The protection film 30 is formed, for example, of silicon nitride (SiN). The protection film 30 is formed, for example, using an ECR sputtering method or a plasma chemical vapor deposition method. The protection film 30 has a thickness, for example, of 10 nm or more and 100 nm or less.

Subsequently, the protection film 30 is patterned by wet etching or dry etching using a photoresist film as a mask. Subsequently, the recess 21 is formed by dry etching or wet etching. The recess 21 is formed so as to go through the barrier layer 16.

Dry etching is performed, for example, using a chlorine-based gas. After dry etching, washing with an acid or an alkali is performed. As the acid, for example, a mixed liquid of sulfuric acid and hydrogen peroxide water, or hydrochloric acid is used. As the alkali, for example, a tetramethylammonium hydroxide (TMAH) aqueous solution is used.

Subsequently, the gate insulating film 22 is deposited on the protection film 30 and the recess 21. The gate insulating film 22 is formed, for example, of silicon oxide ($SiO_x$) or aluminum oxide ($Al_2O_3$). The gate insulating film 22 has a thickness, for example, of 10 nm or more and 100 nm or less.

Subsequently, a metal film for the gate electrode 24 is deposited on the gate insulating film 22. The metal film is formed, for example, of titanium nitride. Subsequently, wet etching of titanium nitride is performed using a photoresist as a mask to form the gate electrode 24. The gate electrode 24 is formed such that an end portion in the gate width direction is located in the recess 21 after etching.

Subsequently, ion implantation is performed using the photoresist and the end portion of the gate electrode 24 as masks to form the device isolation region 26. In the ion implantation, for example, implantation of at least one kind of ion selected from argon (Ar), nitrogen (N), boron (B), and phosphorus (P) is performed.

By using the end portion of the gate electrode 24 as a mask, as illustrated in FIG. 3, the device isolation region 26 is formed in the channel layer 14 below a region in which the gate electrode 24 does not exist at the bottom of the recess 21.

Subsequently, the protection film 30 and the gate insulating film 22 corresponding to a portion in which the source electrode 18 and the drain electrode 20 are formed are removed using the photoresist as a mask. Subsequently, the surface of the barrier layer 16 may be etched to a depth of several nanometers by dry etching.

Subsequently, a photoresist film is formed, and a part corresponding to the source electrode 18 and the drain electrode 20 is patterned. Subsequently, a metal film for the source electrode 18 and the drain electrode 20 is formed. Then, the source electrode 18 and the drain electrode 20 are formed using a lift-off method.

Subsequently, an interlayer film is deposited, and a contact hole with respect to each electrode is formed in the interlayer film. The interlayer film is formed, for example, of silicon oxide ($SiO_x$) or silicon nitride (SiN). Subsequently, wiring is formed on the interlayer film and in the contact hole. One layer or multi layers of interlayer film and wiring may be formed.

By the manufacturing method described above, the HEMT 100 illustrated in FIGS. 1 to 3 is manufactured.

Next, functions and effects of the semiconductor device of the present embodiment will be described.

Figure 4:
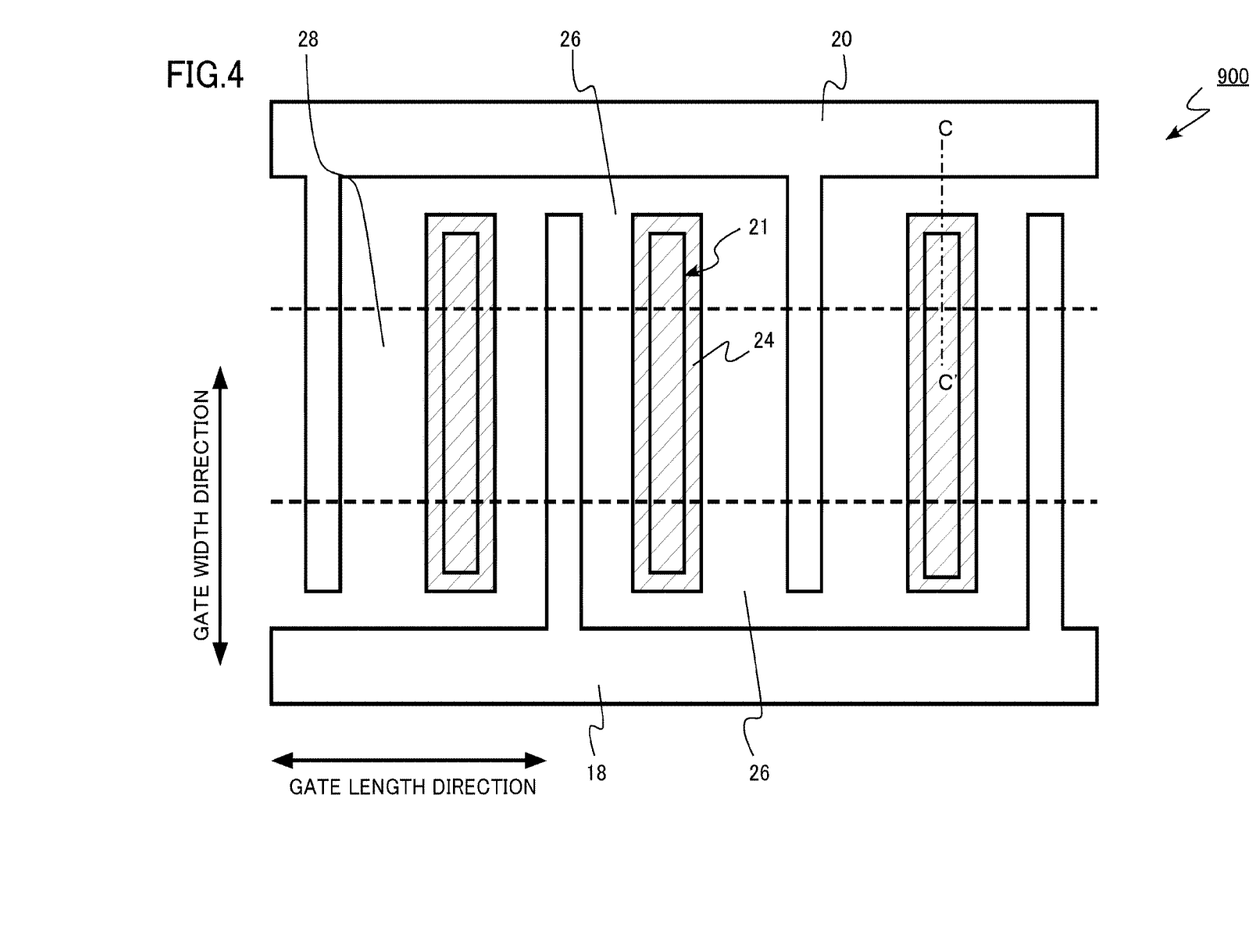
FIG. 4 is a schematic plan view of a semiconductor device of a comparative embodiment.
Figure 5:
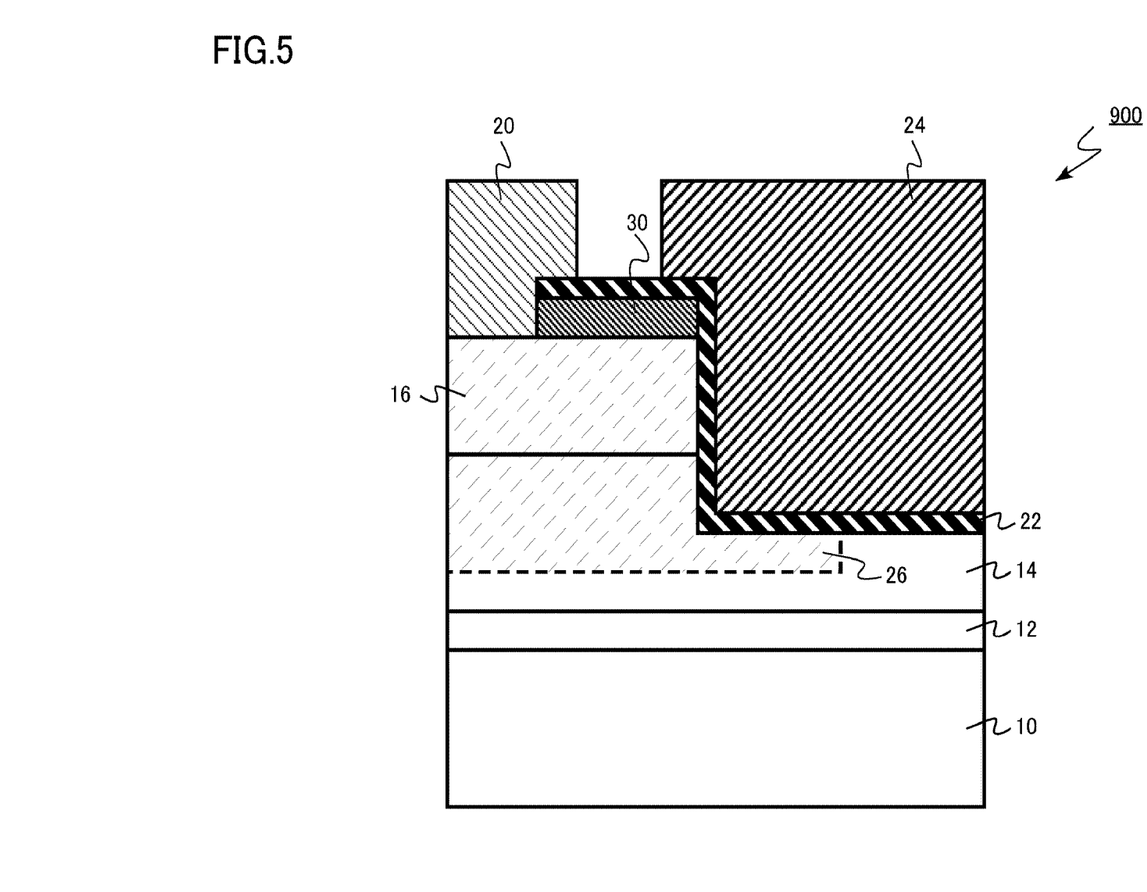
FIG. 5 is a schematic view at the CC' cross section in FIG. 4.

FIG. 4 is a schematic plan view of a semiconductor device of a comparative embodiment. FIG. 5 is a schematic view at the CC' cross section in FIG. 4.

The semiconductor device of the comparative embodiment is a HEMT using a GaN-based semiconductor. A HEMT 900 of the comparative embodiment has a so-called gate/recess structure in which a gate electrode is embedded in a recess formed in a semiconductor layer like the HEMT 100 of the present embodiment.

The HEMT 900 of the comparative embodiment is different from the HEMT 100 of the present embodiment in that the end portion of the gate electrode 24 in the gate width direction is located outside the recess 21. In other words, a fringe with respect to the recess 21 is provided in the end portion of the gate electrode 24 in the gate width direction.

Figure 6:
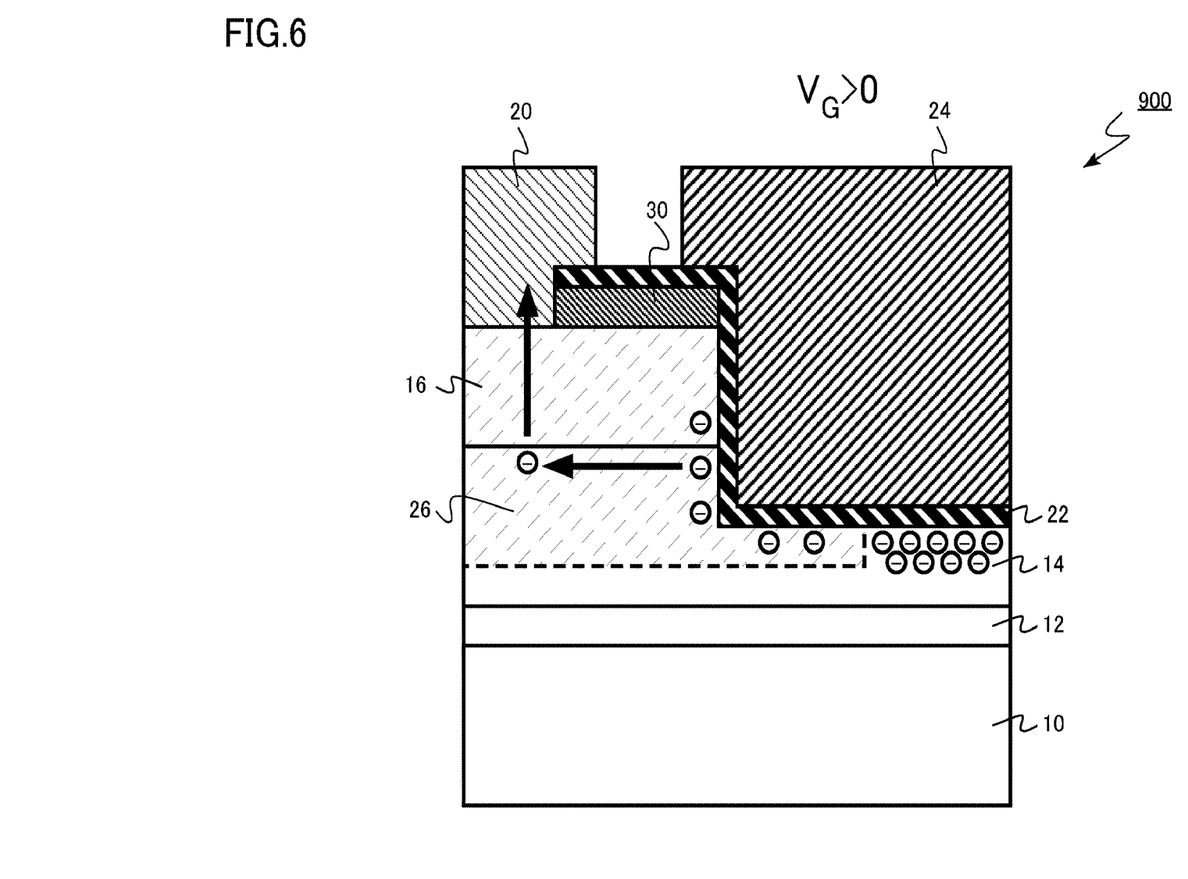
FIG. 6 illustrates functions and effects of the semiconductor device of the first embodiment.
Figure 7:
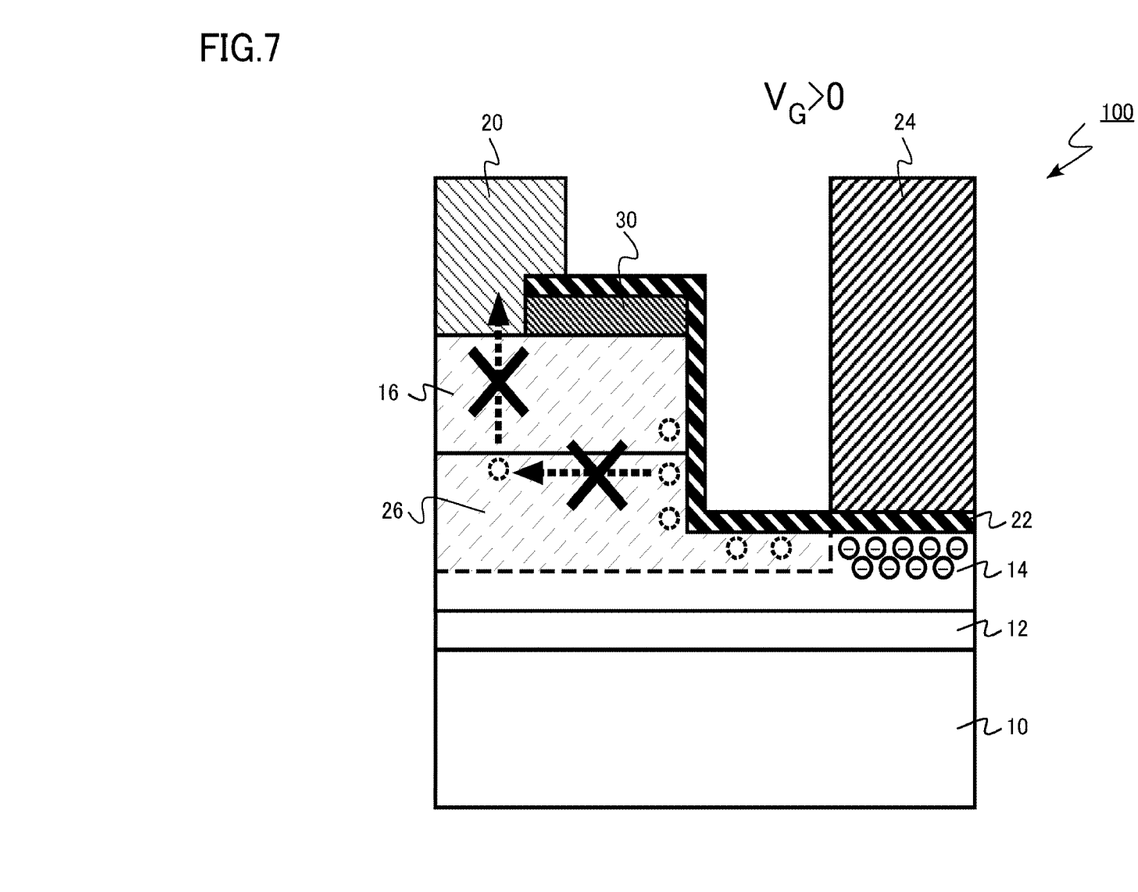
FIG. 7 illustrates functions and effects of the semiconductor device of the first embodiment.

FIGS. 6 and 7 illustrate functions and effects of the semiconductor device of the present embodiment. FIG. 6 illustrates a cross section of the HEMT 900 of the comparative embodiment. FIG. 7 illustrates a cross section of the HEMT 100 of the present embodiment.

It is assumed that a positive voltage for on-operation of the HEMT 900 of the comparative embodiment is applied to a gate electrode of the HEMT 900. In this case, as illustrated in FIG. 6, an inversion layer is formed in the device region 28 below the gate electrode 24, and an electron is generated. Also in the device isolation region 26 at a corner portion of the recess 21, an electron is induced by a voltage applied to the gate electrode 24. A two-dimensional electron gas remains at the heterojunction interface between the channel layer 14 and the barrier layer 16 in the device isolation region 26.

The electron induced at the corner portion of the recess 21 and the two-dimensional electron gas remaining at the heterojunction interface form a parasitic leakage path between the drain electrode 20 and the device region 28 below the gate electrode 24, as illustrated by an arrow in FIG. 6. Therefore, a leakage current flows between the drain electrode 20 and the device region 28.

The leakage current flowing between the drain electrode 20 and the device region 28 may cause, for example, variation in drain current. Alternatively, the continuously flowing leakage current may cause a leakage path also at the time of off-operation to increase an off-current.

It is assumed that a positive voltage for on-operation of the HEMT 100 of the present embodiment is applied to a gate electrode of the HEMT 100. In this case, as illustrated in FIG. 7, an accumulation layer is formed in the device region 28 below the gate electrode 24, and an electron is generated. The gate electrode 24 does not exist in the corner portion of the recess 21. Therefore, unlike the HEMT 900 of the comparative embodiment, an electron is not induced in the device isolation region 26 at the corner portion of the recess 21. Therefore, a leakage path is not formed between the drain electrode 20 and the device region 28 below the gate electrode 24. Therefore, a leakage current is suppressed between the drain electrode 20 and the device region 28.

The length ("$L_1$" in FIG. 1) in the gate length direction at the end portion of the recess 21 in the gate width direction is preferably longer than the length ("$L_2$" in FIG. 1) in the gate length direction at the end portion of the gate electrode 24 in the gate width direction, from a viewpoint of suppressing the leakage current between the drain electrode 20 and the device region 28. By this structure, the end portion of the gate electrode 24 in the gate width direction is surrounded by a region in which the gate electrode 24 does not exist in the bottom of the recess 21. Therefore, a leakage current is suppressed more effectively between the drain electrode 20 and the device region 28.

In the HEMT 100 of the present embodiment, an overlap area between the device isolation region 26 and the gate electrode 24 can be reduced with respect to the HEMT 900 of the comparative embodiment. Therefore, a parasitic capacitance of the gate electrode 24 is reduced. Therefore, the speed of the HEMT 100 can be increased.

In the method for manufacturing the HEMT 100 of the present embodiment, the recess 21 is outside the end portion of the gate electrode 24. Therefore, an ion implantation step for forming the device isolation region 26 can be performed after the gate electrode 24 is formed. For example, as in the HEMT 900 of the comparative embodiment, in a case where the recess 21 is in the end portion of the gate electrode 24, when the ion implantation step for forming the device isolation region 26 is performed after the gate electrode 24 is formed, the device isolation region 26 is not formed below the end portion of the gate electrode 24, and a leakage path between a source and a drain remains. In the HEMT 100 of the present embodiment, such a leakage path is not formed structurally. Therefore, a normally-off operation can be maintained even when the ion implantation step for forming the device isolation region 26 is performed after the gate electrode 24 is formed.

When the ion implantation step for forming the device isolation region 26 is performed before the gate electrode 24 is formed, it is necessary to insert a resist coating process between the step for forming the recess 21 and the step for depositing a material for the gate electrode 24. In this case, reliability of the gate insulating film 22 may be deteriorated due to contamination caused by the resist coating process.

In the method for manufacturing the HEMT 100 of the present embodiment, it is not necessary to insert the resist coating process between the step for forming the recess 21 and the step for depositing a material for the gate electrode 24. Therefore, reliability of the gate insulating film 22 is improved.

As described above, the semiconductor device of the present embodiment can suppress a leakage current. In addition, the speed of the HEMT is increased. Furthermore, the method for manufacturing the semiconductor device of the present embodiment improves reliability of the gate insulating film.

Second Embodiment

A semiconductor device of the present embodiment is similar to that in the first embodiment except that a bottom of a recess is located in a second GaN-based semiconductor layer and a distance between the bottom of the recess and a first GaN-based semiconductor layer is 5 nm or less. Therefore, description of contents overlapping with the first embodiment will be omitted.

Figure 8:
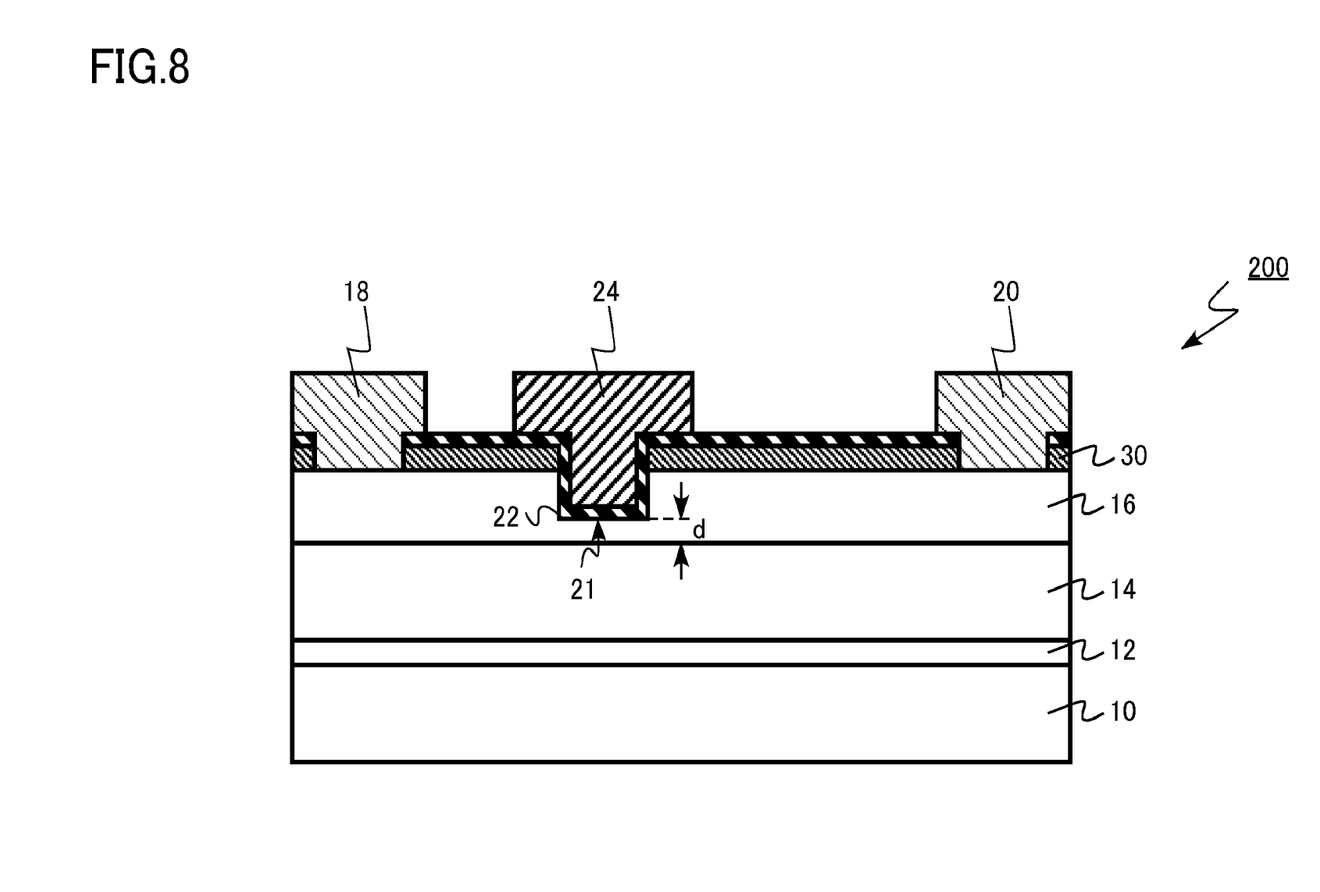
FIG. 8 is a schematic cross sectional view of a semiconductor device of a second embodiment.

FIG. 8 is a schematic cross sectional view of the semiconductor device of the present embodiment.

The semiconductor device of the present embodiment is a HEMT using a GaN-based semiconductor. A HEMT 200 of the present embodiment has a so-called gate/recess structure in which a gate electrode is embedded in a recess formed in a semiconductor layer like the HEMT 100 of the first embodiment.

In the HEMT 200 of the present embodiment, a bottom of a recess 21 is located in a barrier layer (second GaN-based semiconductor layer) 16. A distance ("d" in FIG. 8) between the bottom of the recess 21 and a channel layer (first GaN-based semiconductor layer) 14 is preferably 5 nm or less from a viewpoint of realizing a normally-off operation.

The semiconductor device of the present embodiment can suppress a leakage current as in the first embodiment. In addition, the speed of the HEMT is increased. Furthermore, the method for manufacturing the semiconductor device of the present embodiment improves reliability of the gate insulating film.

In the embodiments, GaN or AlGaN has been illustrated as a material for the GaN-based semiconductor layer. However, for example, it is also possible to apply InGaN, InAlN, or InAlGaN containing indium (In). It is also possible to apply AlN as a material for the GaN-based semiconductor layer.

In the embodiments, undoped AlGaN has been illustrated as a barrier layer. However, it is also possible to apply n-type AlGaN.

While certain embodiments have been described, these embodiments have been presented by way of example only, and are not intended to limit the scope of the inventions. Indeed, a semiconductor device and a method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first GaN-based semiconductor layer;
   a second GaN-based semiconductor layer provided on the first GaN-based semiconductor layer, the second GaN-based semiconductor layer having a larger bandgap than the first GaN-based semiconductor layer;
   a source electrode provided on the second GaN-based semiconductor layer;
   a drain electrode provided on the second GaN-based semiconductor layer;
   a recess provided between the source electrode and the drain electrode in the second GaN-based semiconductor layer;
   a gate insulating film provided on a surface of the recess; and
   a gate electrode provided on the gate insulating film, the gate electrode having an end portion in a gate width direction, located in the recess,
   wherein a first distance between the gate electrode and the bottom of the recess is shorter than a second distance between an end portion of the gate electrode in the gate width direction and a side surface of the recess, a length of the gate electrode in a gate width direction is larger than a length of the gate electrode in a gate length direction, a length of the recess in the gate width direction is larger than a length of the recess in the gate length direction, and the length of the recess in the gate width direction is larger than the length of the gate electrode in the gate width direction.

2. The device according to claim 1, wherein a length of the recess in a gate length direction at an end portion of the recess in the gate width direction is longer than a length of the gate electrode in the gate length direction at the end portion of the gate electrode in the gate width direction.

3. The device according to claim 1, wherein a length of the recess in a gate length direction at a central portion of the recess in the gate width direction is shorter than a length of the gate electrode in the gate length direction at a central portion of the gate electrode in the gate width direction.

4. The device according to claim 1, further comprising a device isolation region provided in the first GaN-based semiconductor layer and the second GaN-based semiconductor layer, wherein an end portion of the recess in the gate width direction and the end portion of the gate electrode in the gate width direction are on the device isolation region.

5. The device according to claim 1, wherein a bottom of the recess is located in the first GaN-based semiconductor layer.

6. The device according to claim 1, wherein a bottom of the recess is located in the second GaN-based semiconductor layer and a distance between the bottom of the recess and the first GaN-based semiconductor layer is 5 nm or less.

7. The device according to claim 1, wherein the length of the recess in the gate length direction at the end portion of the recess in the gate width direction is longer than the length of the gate electrode in the gate length direction at a central portion of the gate electrode in the gate width direction, and the length of the gate electrode in the gate length direction at the end portion of the gate electrode in the gate width direction is longer than the length of the recess in a gate length direction at a central portion of the recess in the gate width direction.

8. A semiconductor device comprising:
a first GaN-based semiconductor layer;
a second GaN-based semiconductor layer provided on the first GaN-based semiconductor layer, the second GaN-based semiconductor layer having a larger bandgap than the first GaN-based semiconductor layer;
a source electrode provided on the second GaN-based semiconductor layer;
a drain electrode provided on the second GaN-based semiconductor layer;
a recess provided between the source electrode and the drain electrode in the second GaN-based semiconductor layer;
a gate insulating film provided on a surface of the recess; and
a gate electrode provided on the gate insulating film, located in the recess,
wherein a length of the gate electrode in a gate width direction is larger than a length of the gate electrode in a gate length direction,
a length of the recess in the gate width direction is larger than a length of the recess in the gate length direction, and
the length of the recess in the gate width direction is larger than the length of the gate electrode in the gate width direction.

9. The device according to claim 8, wherein the length of the recess in the gate length direction at an end portion of the recess in the gate width direction is longer than the length of the gate electrode in the gate length direction at an end portion of the gate electrode in the gate width direction.

10. The device according to claim 8, wherein the length of the recess in the gate length direction at a central portion of the recess in the gate width direction is shorter than the length of the gate electrode in the gate length direction at a central portion of the gate electrode in the gate width direction.

11. The device according to claim 8, further comprising a device isolation region provided in the first GaN-based semiconductor layer and the second GaN-based semiconductor layer, wherein
an end portion of the recess in the gate width direction and the end portion of the gate electrode in the gate width direction are on the device isolation region.

12. The device according to claim 8, wherein the length of the recess in the gate length direction at the end portion of the recess in the gate width direction is longer than the length of the gate electrode in the gate length direction at a central portion of the gate electrode in the gate width direction, and the length of the gate electrode in the gate length direction at the end portion of the gate electrode in the gate width direction is longer than the length of the recess in the gate length direction at a central portion of the recess in the gate width direction.

13. A semiconductor device comprising:
a first GaN-based semiconductor layer;
a second GaN-based semiconductor layer provided on the first GaN-based semiconductor layer, the second GaN-based semiconductor layer having a larger bandgap than the first GaN-based semiconductor layer;
a source electrode provided on the second GaN-based semiconductor layer;
a drain electrode provided on the second GaN-based semiconductor layer;
a recess provided between the source electrode and the drain electrode in the second GaN-based semiconductor layer;
a gate insulating film provided on a surface of the recess; and
a gate electrode provided on the gate insulating film, located in the recess,
wherein a length of the recess in a gate width direction is larger than a length of the gate electrode in the gate width direction, and
the length of the recess in a gate length direction at an end portion of the recess in the gate width direction is longer than the length of the gate electrode in the gate length direction at an end portion of the gate electrode in the gate width direction.

14. A semiconductor device comprising:
a first GaN-based semiconductor layer;
a second GaN-based semiconductor layer provided on the first GaN-based semiconductor layer, the second GaN-based semiconductor layer having a larger bandgap than the first GaN-based semiconductor layer;
a source electrode provided on the second GaN-based semiconductor layer;
a drain electrode provided on the second GaN-based semiconductor layer;
a recess provided between the source electrode and the drain electrode in the second GaN-based semiconductor layer;
a gate insulating film provided on a surface of the recess; and
a gate electrode provided on the gate insulating film, the gate electrode having an end portion in a gate width direction, located in the recess,
wherein a first distance between the gate electrode and the bottom of the recess is shorter than a second distance between an end portion of the gate electrode in the gate width direction and a side surface of the recess, the gate length direction is parallel to a direction in which a current of the transistor flows, and the gate width direction is perpendicular to the gate length direction.

15. The device according to claim 14, further comprising a device isolation region provided in the first GaN-based semiconductor layer and the second GaN-based semiconductor layer, wherein
an end portion of the recess in the gate width direction and the end portion of the gate electrode in the gate width direction are on the device isolation region.

16. The device according to claim 15, wherein the device isolation region is formed by implantation of at least one kind of ion selected from argon (Ar), nitrogen (N), boron (B), and phosphorus (P) into the first GaN-based semiconductor layer and the second GaN-based semiconductor layer.

17. A semiconductor device comprising:
a first GaN-based semiconductor layer;
a second GaN-based semiconductor layer provided on the first GaN-based semiconductor layer, the second GaN-based semiconductor layer having a larger bandgap than the first GaN-based semiconductor layer;
a source electrode provided on the second GaN-based semiconductor layer;
a drain electrode provided on the second GaN-based semiconductor layer;
a recess provided between the source electrode and the drain electrode in the second GaN-based semiconductor layer;
a gate insulating film provided on a surface of the recess; and
a gate electrode provided on the gate insulating film, located in the recess,
wherein a length of the gate electrode in a gate width direction is larger than a length of the gate electrode in a gate length direction,
a length of the recess in the gate width direction is larger than a length of the recess in the gate length direction,
the length of the recess in the gate width direction is larger than the length of the gate electrode in the gate width direction,
the gate length direction is parallel to a direction in which a current of the transistor flows, and the gate width direction is perpendicular to the gate length direction.

18. The device according to claim 17, further comprising a device isolation region provided in the first GaN-based semiconductor layer and the second GaN-based semiconductor layer, wherein
an end portion of the recess in the gate width direction and the end portion of the gate electrode in the gate width direction are on the device isolation region.

19. The device according to claim 18, wherein the device isolation region is formed by implantation of at least one kind of ion selected from argon (Ar), nitrogen (N), boron (B), and phosphorus (P) into the first GaN-based semiconductor layer and the second GaN-based semiconductor layer.

20. The device according to claim 1, further comprising a device isolation region provided in the first GaN-based semiconductor layer and the second GaN-based semiconductor layer, a boundary being provided between the first GaN-based semiconductor layer and the first the device isolation region, wherein
an end portion of the recess in the gate width direction is on the device isolation region, and a side surface of the end portion of the gate electrode in the gate width direction is right on the boundary.

21. The device according to claim 8, further comprising a device isolation region provided in the first GaN-based semiconductor layer and the second GaN-based semiconductor layer, a boundary being provided between the first GaN-based semiconductor layer and the first the device isolation region, wherein
an end portion of the recess in the gate width direction is on the device isolation region, and a side surface of the end portion of the gate electrode in the gate width direction is right on the boundary.

22. The device according to claim 13, further comprising a device isolation region provided in the first GaN-based semiconductor layer and the second GaN-based semiconductor layer, a boundary being provided between the first GaN-based semiconductor layer and the first the device isolation region, wherein
an end portion of the recess in the gate width direction is on the device isolation region, and a side surface of the end portion of the gate electrode in the gate width direction is right on the boundary.

23. The device according to claim 14, further comprising a device isolation region provided in the first GaN-based semiconductor layer and the second GaN-based semiconductor layer, a boundary being provided between the first GaN-based semiconductor layer and the first the device isolation region, wherein
an end portion of the recess in the gate width direction is on the device isolation region, and a side surface of the end portion of the gate electrode in the gate width direction is right on the boundary.

24. The device according to claim 17, further comprising a device isolation region provided in the first GaN-based semiconductor layer and the second GaN-based semiconductor layer, a boundary being provided between the first GaN-based semiconductor layer and the first the device isolation region, wherein
an end portion of the recess in the gate width direction is on the device isolation region, and a side surface of the end portion of the gate electrode in the gate width direction is right on the boundary.

* * * * *